(12) United States Patent
Dirks et al.

(10) Patent No.: US 8,645,109 B2
(45) Date of Patent: Feb. 4, 2014

(54) METHODS AND APPARATUS FOR DETERMINING ELECTROMAGNETIC SCATTERING PROPERTIES AND STRUCTURAL PARAMETERS OF PERIODIC STRUCTURES

(75) Inventors: Remco Dirks, Deurne (NL); Irwan Dani Setija, Utrecht (NL); Markus Gerardus Martinus Maria Van Kraaij, Eindhoven (NL); Martijn Constant Van Beurden, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 429 days.

(21) Appl. No.: 12/955,463

(22) Filed: Nov. 29, 2010

(65) Prior Publication Data

US 2011/0137625 A1 Jun. 9, 2011

Related U.S. Application Data

(60) Provisional application No. 61/267,627, filed on Dec. 8, 2009.

(51) Int. Cl.
*G06F 7/60* (2006.01)
*G06F 17/10* (2006.01)

(52) U.S. Cl.
USPC .............................................. 703/2; 716/53

(58) Field of Classification Search
USPC .................................................. 703/2; 716/53
See application file for complete search history.

(56) References Cited

U.S. PATENT DOCUMENTS 5,880,838 A * 3/1999 Marx et al. ................. 356/498
6,884,961 B1 * 4/2005 Dmitriev et al. ......... 219/121.69
7,176,459 B2 * 2/2007 Watanabe et al. ............. 250/310
2007/0153275 A1 7/2007 Aa et al.
2008/0129986 A1 * 6/2008 Walsh .......................... 356/138

FOREIGN PATENT DOCUMENTS

EP 1 628 164 A2 2/2006

OTHER PUBLICATIONS

R. E. Plessix, "A review of the adjoint-state method for computing the gradiant of a functional with geophsical applications" Geophys. J. Int. (2006) 167, pp. 495-503.*
Lesselier, D., "Optimization Techniques and Inverse Problems: Reconstruction of Conductivity Profiles in the Time Domain," IEEE Transactions on Antennas and Propagation, vol. AP-30, No. 1, Jan. 1982; pp. 59-65.
Van Beurden, M.C., "Integro-differential equations for electromagnetic scattering: analysis and computation for objects with electric contrast," Section 5.1, PhD Thesis, Eindhoven University of Technology, Sep. 2003; pp. 90-93.

* cited by examiner

*Primary Examiner* — Dwin M Craig
(74) *Attorney, Agent, or Firm* — Sterne, Kessler, Goldstein & Fox P.L.L.C.

(57) ABSTRACT

Numerical calculation of electromagnetic scattering properties and structural parameters of periodic structures is disclosed. A reflection coefficient has a representation as a bilinear or sesquilinear form. Computations of reflection coefficients and their derivatives for a single outgoing direction can benefit from an adjoint-state variable. Because the linear operator is identical for all angles of incidence that contribute to the same outgoing wave direction, there exists a single adjoint-state variable that generates all reflection coefficients from all incident waves that contribute to the outgoing wave. This adjoint-state variable can be obtained by numerically solving a single linear system, whereas one otherwise would need to solve a number of linear systems equal to the number of angles of incidence.

17 Claims, 6 Drawing Sheets

METHODS AND APPARATUS FOR DETERMINING ELECTROMAGNETIC SCATTERING PROPERTIES AND STRUCTURAL PARAMETERS OF PERIODIC STRUCTURES

CROSS REFERENCE TO RELATED APPLICATIONS

This application claims the benefit under 35 U.S.C. 119(e) of U.S. Provisional Patent Application No. 61/267,627, filed Dec. 8, 2009, which is incorporated by reference herein in its entirety.

FIELD

The present invention relates to numerical calculation of electromagnetic scattering properties and structural parameters of periodic structures. The invention may be applied for example in metrology of microscopic structures, for example to assess critical dimensions (CD) performance and to qualify imaging performance of a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, it is necessary to measure parameters of the patterned substrate, for example critical linewidth in a developed metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a metrology target (see FIG. 5a) on the surface of the substrate and properties of the scattered or reflected beam are measured (see FIG. 5b). By comparing the properties of the beam before and after it has been reflected or scattered by the substrate, the properties of the metrology target can be determined. This can be done, for example, by comparing the reflected beam with data stored in a library of known measurements associated with known metrology target properties. Two main types of scatterometer are known. Spectroscopic scatterometers direct a broadband radiation beam onto the metrology target and measure the spectrum (intensity as a function of wavelength) of the radiation scattered into a particular narrow angular range. Angularly resolved scatterometers use a monochromatic radiation beam and measure the intensity of the scattered radiation as a function of angle.

The properties of the metrology target can also be determined by modelling the metrology target and scattering by it, and then matching modeled and measured scatterometry results. The modelling may be performed using a numerical solver.

In angle-resolved metrology, the image on the detector in an angularly resolved scatterometer is determined by the outgoing scattered waves. However, in many cases a single outgoing-wave direction can be the result of multiple incident-wave directions (see FIG. 6). For a solver that computes electromagnetic scattering properties such as reflection or transmission coefficients as a function of the direction of incidence, the solver has to be run several times for each angle of incidence that contributes to the direction of scattering. The subsequent step of computing derivatives with respect to structural parameters results in even more computations, especially when finite-difference approximations are used.

SUMMARY

It is desirable in the field of semiconductor processing to reduce the number of computations in order to rapidly perform numerical calculations of electromagnetic scattering properties and structural parameters of periodic structures.

According to a first aspect of the invention, there is provided a method of determining electromagnetic scattering properties of a periodic structure, said method comprising the steps: numerically solving a linear system using an adjoint-state operator ($L^+$) and an adjoint-state variable ($v_n$), thereby obtaining an approximate solution of said adjoint-state variable ($v_n$) and determining scattering coefficients ($R_{m,n}$) in an outgoing direction from said structure for radiation incident to said structure based on said obtained approximate solution of said adjoint-state variable ($v_n$) and an incident-field vector ($f_m$) corresponding to said radiation incident to said structure.

The method may further comprise the steps of: providing a plurality of expressions for determining derivatives of said scattering coefficients ($R_{m,n}$); selecting an expression of said plurality of expressions to minimize the number of linear systems to solve; and using said selected expression to determine a derivative ($\partial_k R_{m,n}$) of said scattering coefficients.

The step of determining scattering coefficients ($R_{m,n}$) in an outgoing direction from said structure may be performed for radiation incident to said structure at a plurality of incoming directions.

According to a second aspect of the invention, there is provided an apparatus for determining electromagnetic scattering properties ($S(p)$) of a periodic structure, the apparatus comprising: a processor configured to: obtain at least one estimated structural parameter ($p$); and determine at least one model electromagnetic scattering property ($S(p)$) from said at least one estimated structural parameter ($p$); wherein said processor is configured to determine said model electromagnetic scattering property ($S(p)$) using a method of determining electromagnetic scattering properties of a periodic structure, said method comprising the steps: numerically solving a linear system using an adjoint-state operator ($L^+$) and an adjoint-state variable ($v_n$), thereby obtaining an approximate solution of said adjoint-state variable ($v_n$); and determining scattering coefficients ($R_{m,n}$) in an outgoing direction from said structure for radiation incident to said structure based on said obtained approximate solution of said adjoint-state variable ($v_n$) and an incident-field vector ($J_m$) corresponding to said radiation incident to said structure.

According to a third aspect of the invention, there is provided a computer program product containing one or more sequences of machine-readable instructions for determining electromagnetic scattering properties (S(p)) of a periodic structure, the instructions being adapted to cause one or more processors to perform a method of determining electromagnetic scattering properties (S(p)) of a periodic structure, said method comprising the steps: numerically solving a linear system using an adjoint-state operator ($L^+$) and an adjoint-state variable ($v_n$), thereby obtaining an approximate solution of said adjoint-state variable ($v_n$); and determining scattering coefficients ($R_{m,n}$) in an outgoing direction from said structure for radiation incident to said structure based on said obtained approximate solution of said adjoint-state variable ($v_n$) and an incident-field vector ($f_m$) corresponding to said radiation incident to said structure.

According to a fourth aspect of the invention, there is provided a method of determining structural parameters (p) of a periodic structure from a detected electromagnetic scattering property (M) arising from illumination of said structure by radiation, said method comprising the steps: obtaining at least one estimated structural parameter (p); determining at least one model electromagnetic scattering property (S(p)) from said at least one estimated structural parameter (p); comparing said detected electromagnetic scattering property (M) to said at least one model electromagnetic scattering property (S(p)); and determining an approximate structural parameter (p') based on the result of the comparison, wherein said model electromagnetic scattering property (S(p)) is determined using a method of determining electromagnetic scattering properties of a periodic structure, said method comprising the steps: numerically solving a linear system using an adjoint-state operator ($L^+$) and an adjoint-state variable ($v_n$), thereby obtaining an approximate solution of said adjoint-state variable ($v_n$); and determining scattering coefficients ($R_{m,n}$) in an outgoing direction from said structure for radiation incident to said structure based on said obtained approximate solution of said adjoint-state variable ($v_n$) and an incident-field vector ($f_m$) corresponding to said radiation incident to said structure.

According to a fifth aspect of the invention, there is provided an inspection apparatus for determining structural parameters (p) of a periodic structure, the inspection apparatus comprising: an illumination system configured to illuminate said structure with radiation; a detection system configured to detect an electromagnetic scattering property (M)) arising from said illumination: a processor configured to: obtain at least one estimated structural parameter (p); determine at least one model electromagnetic scattering property (S(p)) from said at least one estimated structural parameter (p); compare said detected electromagnetic scattering property (M) to said at least one model electromagnetic scattering property (S(p)); and determine an approximate structural parameter (p') based on the result of the comparison, wherein said processor is configured to determine said model electromagnetic scattering property (S(p)) using a method of determining electromagnetic scattering properties of a periodic structure, said method comprising the steps: numerically solving a linear system using an adjoint-state operator ($L^+$) and an adjoint-state variable ($v_n$), thereby obtaining an approximate solution of said adjoint-state variable ($v_n$); and determining scattering coefficients ($R_{m,n}$) in an outgoing direction from said structure for radiation incident to said structure based on said obtained approximate solution of said adjoint-state variable ($v_n$) and an incident-field vector ($f_m$) corresponding to said radiation incident to said structure.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
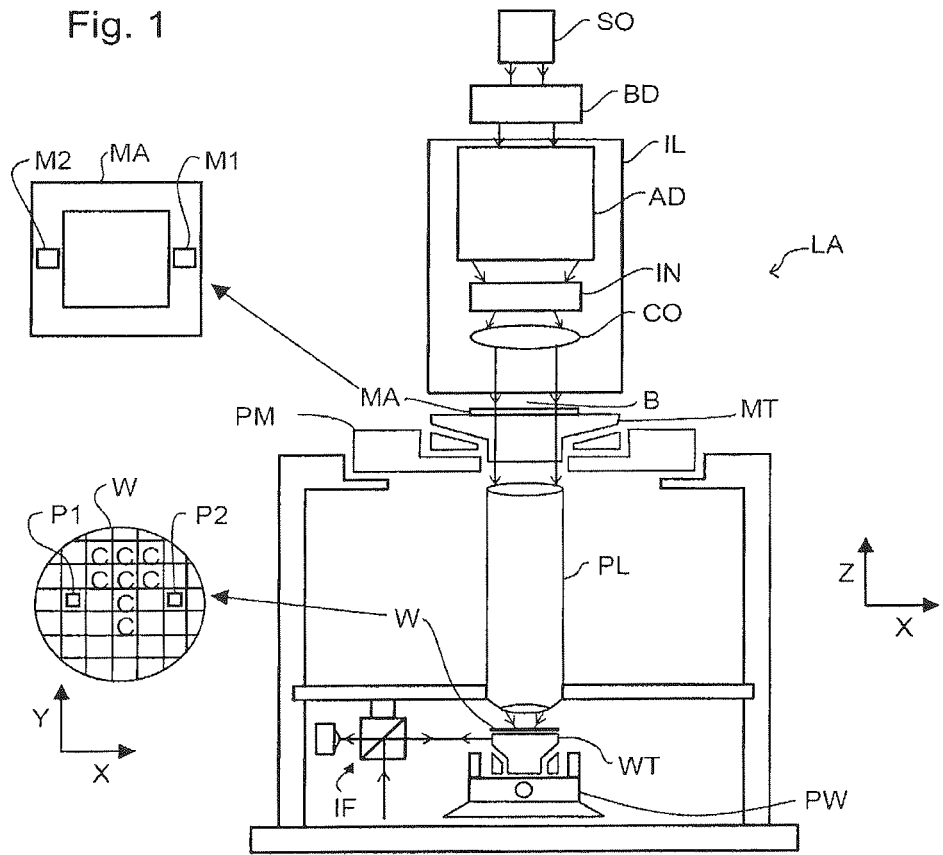
FIG. 1 depicts a lithographic apparatus.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus. The apparatus comprises: an illumination system (illuminator) IL configured to condition a radiation beam B (e.g. UV radiation or DUV radiation), a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:
1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-) magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable minor array of a type as referred to above.

Combinations and/or variations on the above described modes of use or entirely different modes of use may also be employed.

Figure 2:
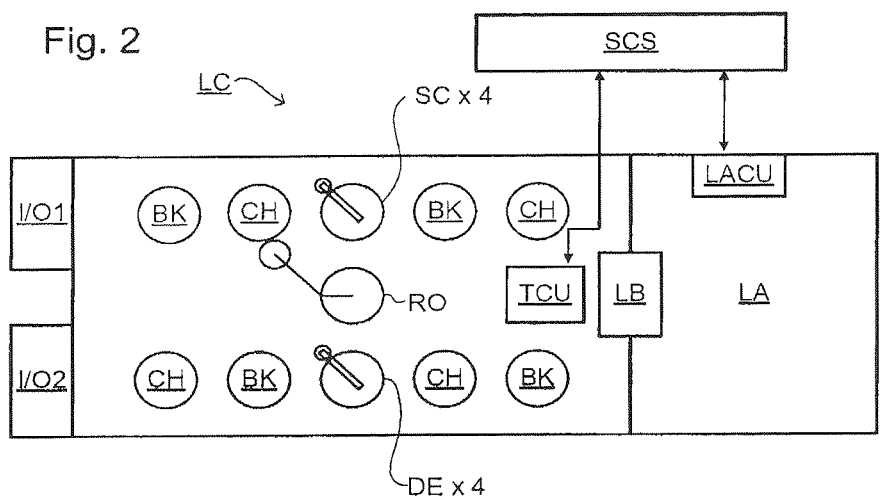
FIG. 2 depicts a lithographic cell or cluster.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded, thereby avoiding performing exposures on substrates that are known to be faulty. In a case where only some target portions of a substrate are faulty, further exposures can be performed only on those target portions that are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measures properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
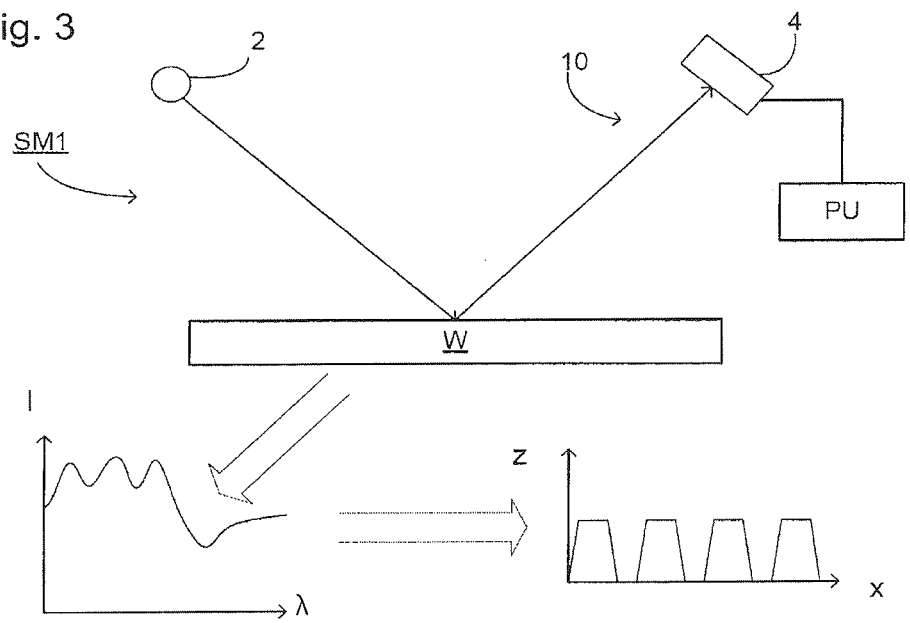
FIG. 3 depicts a first scatterometer.

FIG. 3 depicts a scatterometer which may be used in the present invention. It comprises a broadband (white light) radiation projector 2 which projects radiation onto a substrate W. The scattered radiation is passed to a spectrometer detector 4, which measures a spectrum 10 (intensity as a function of wavelength) of the scattered radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
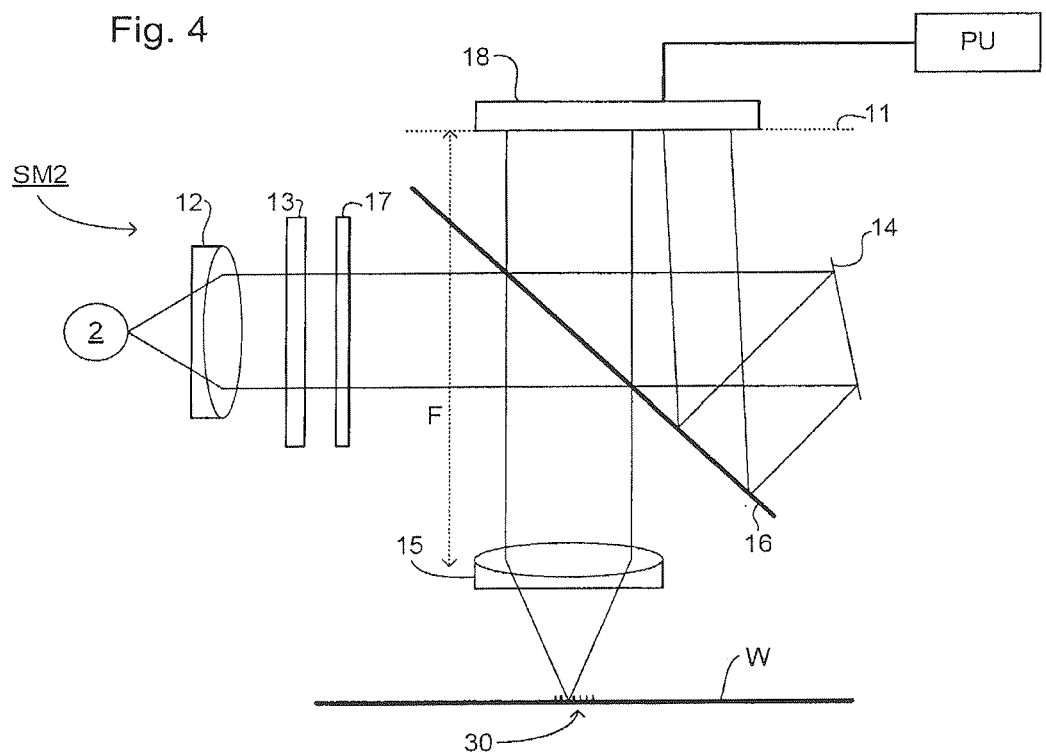
FIG. 4 depicts a second scatterometer.

Another scatterometer that may be used with the present invention is shown in FIG. 4. In this device, the radiation emitted by radiation source 2 is collimated using lens system 12 and transmitted through interference filter 13 and polarizer 17, reflected by partially reflecting surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflective surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the zenith angle of incidence and the angular position defines azimuth angle of the radiation. The detector is preferably a two-dimensional detector so that a two-dimensional angular scatter spectrum of a metrology target 30 can be measured. The detector 18 may be, for example, an array of CCD or CMOS sensors, and may use an integration time of for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18 or alternatively a different detector.

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e. one with a wide range of light frequencies or wavelengths—and therefore of colors) is possible, which gives a large etendue, allowing the mixing of multiple wavelengths. The plurality of wavelengths in the broadband preferably each has a bandwidth of $\Delta\lambda$ and a spacing of at least 2 $\Delta\lambda$ (i.e. twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A.

The metrology target 30 on substrate W may be a 1-D grating, which is printed such that after development, the bars are formed of solid resist lines. The metrology target 30 may be a 2-D grating, which is printed such that after development, the grating is formed of solid resist pillars or vias in the resist. The bars, pillars or vias may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The structural parameters of the 1-D grating, such as line widths, material parameters and shapes, or structural parameters of the 2-D grating, such as pillar or via widths or lengths or shapes, may be input to the reconstruction process, performed by processing unit PU, from knowledge of the printing step and/or other scatterometry processes.

Figure 5A:
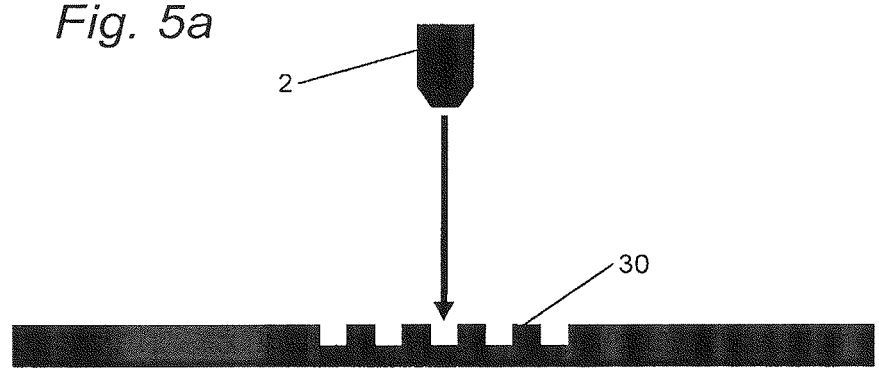
FIG. 5a illustrates a radiation beam incident on a metrology target and FIG. 5b illustrates the resulting diffraction orders.
Figure 5B:
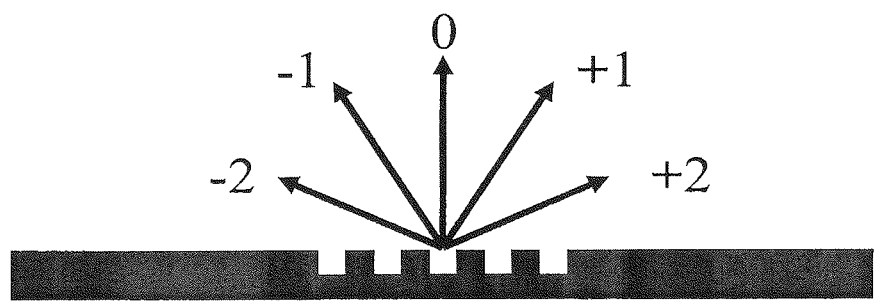
Figure 9:
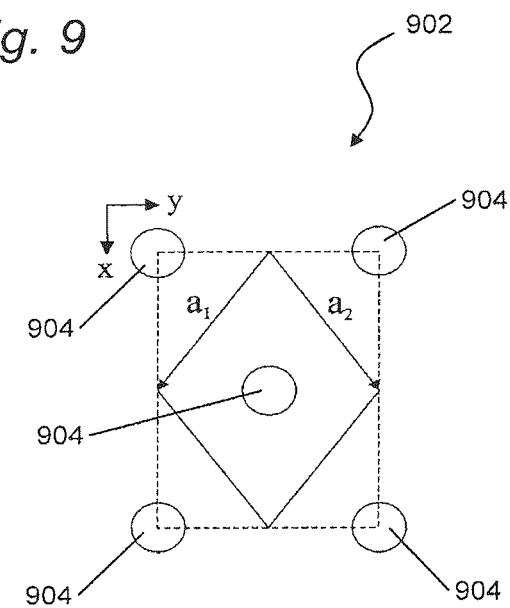
FIG. 9 illustrates a unit cell of a periodic structure and corresponding Bravais lattice vectors.

In rigorous diffraction modeling (e.g. for CD-reconstruction) for 1-D and 2-D periodic gratings, electromagnetic scattering properties such as reflection coefficients are computed for a given angle of incidence (for example, see FIG. 5a) from an illumination source 2 onto a grating metrology target 30. Depending on the pitch and the wavelength, this computation results in one or more reflection coefficients. In case of more than one reflection coefficient, this results in outgoing waves that correspond to several different angles of scattering, the so-called diffraction order grid. FIG. 5b shows zeroth (0), first (+/−1) and second order (+/−2) angles. The scattering of higher diffraction orders arising from a periodic grating are discussed later with reference to FIG. 9.

In a typical reconstruction loop, the above step is followed by a step to compute derivatives of reflection coefficients with respect to structural parameters, to produce the next search direction for the nonlinear solver that guides the reconstruction loop. These derivatives may be approximations obtained by a finite-difference method, i.e. computing the reflection coefficients at two slightly different values of the specific structural parameter. For the particular case of RCWA, an analytical method has been proposed to obtain the derivatives from RCWA (US patent publication 2007/0153275 A1), which is incorporated herein by reference in its entirety.

The derivatives of a bilinear or sesquilinear form with respect to a number of parameters (i.e. more than 2) can benefit from a so-called adjoint-state variable, which reduces the number of linear systems that have to be solved, see for example D. Lesselier, "Optimization techniques and inverse problems: reconstruction of conductivity profiles in the time domain", IEEE Trans. Antennas Propagat., Vol. 30, p. 59-65, 1982 and M. C. van Beurden, "Integro-differential equations for electromagnetic scattering: analysis and computation for objects with electric contrast", PhD Thesis, Eindhoven University of Technology, section 5.1, September 2003, which are incorporated herein by reference in their entirety.

A reflection coefficient has a representation as a bilinear or sesquilinear form. Hence, the computations of reflection coefficients and their derivatives (or their approximations) for a single outgoing direction can also benefit from an adjoint-state variable.

Figure 6:
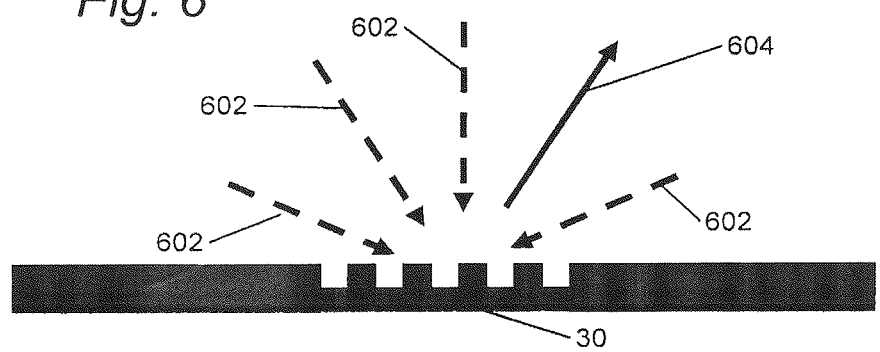
FIG. 6 illustrates a single outgoing-wave direction resulting from multiple incident-waves.

A physical description is given below with reference to FIG. 6.

Owing to the fact that the linear operator is identical for all angles of incidence 602 to the metrology target 30 that contribute to the same outgoing wave direction 604, there exists a single adjoint-state variable ($v_n$) for each detected polarization state that generates all reflection coefficients from all incident waves that contribute to the outgoing wave. This adjoint-state variable can be obtained by numerically solving a single linear system, thereby obtaining an approximate solution of the adjoint-state variable ($v_n$), whereas one otherwise would need to solve a number of linear systems equal to the number of angles of incidence. Note that after discretization, the equality of the operators for different angles on the diffraction grid may be slightly distorted, owing to the fact that the operator is asymmetrically truncated.

To generate the subsequent derivatives with respect to shape, one can again benefit from adjoint-state variables. However, now there is a trade-off between the adjoint-state variables used for the reflection coefficients and those for the derivatives. Nevertheless, in case of multiple derivatives and reflection coefficients, there is still room to reduce the number of linear systems that have to be solved.

Figure 7:
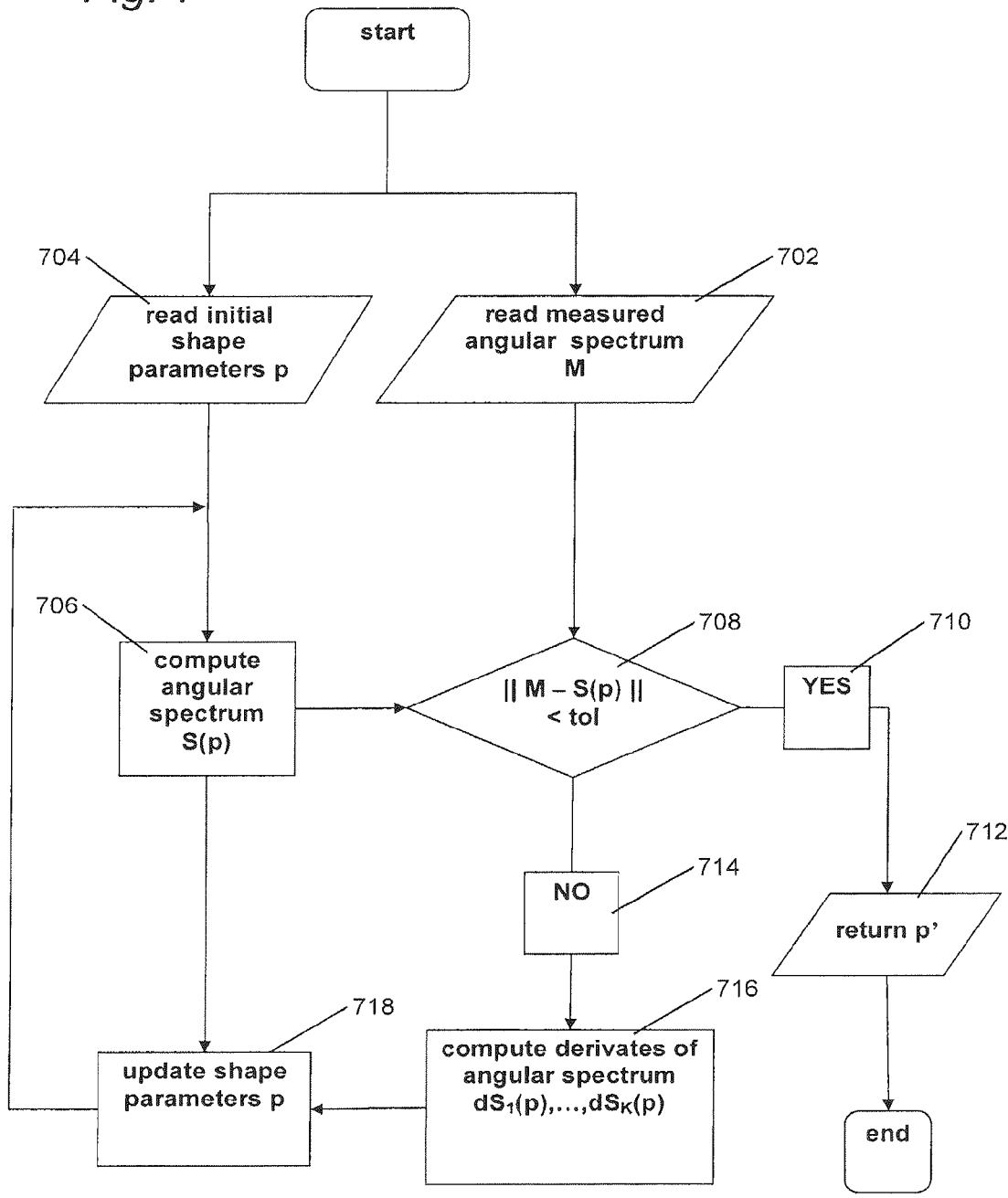
FIG. 7 is a flow chart of a typical grating (shape-) reconstruction done by an angle-resolved scatterometer.

In FIG. 7, a schematic overview is given of a typical grating (shape-) reconstruction performed by an angle-resolved scatterometer. The input of the reconstruction is a measured electromagnetic scattering property such as an angular spectrum M 702 and a set of initial material and shape parameters p 704 (say K independent parameters) that represent an estimate of the structure of the metrology target grating. From this set of initial structural parameters a computed spectrum S(p) is determined 706. Then, both the measured and computed spectrum are compared 708.

If the difference between the two is smaller than a given tolerance 710, the reconstruction is completed successfully and the output structural parameters p' 712 are the set of structural parameters p that were used to determine the computed spectrum.

If the difference between the two is still larger than the given tolerance 714, the structural parameters have to be changed for another iteration. In order to update the structural parameters, K additional derivatives of the spectrum, i.e. $dS_1$(p), ..., $dS_K$(p), are determined 716. Thus, together with the nominal computed spectrum, the structural parameters are updated 718 based on the result of the comparison step 708 in a previous iteration. Now a new computed spectrum is determined 706 which is again compared 708 to the measured spectrum.

The updating of structural parameters continues until convergence is reached and the difference is smaller than the given tolerance 710 or until a maximum number of iterations is reached.

Embodiments of the present invention may be implemented in two blocks in this flowchart: the computation of the nominal spectrum 706 and its derivatives 716.

In another embodiment, at steps 704 and 706 may be repeated to create a plurality of computed spectra S(p) that are arranged in a library and the step of comparing 708 involves matching the detected spectrum (M) to contents of the library. The library may be generated using different sets of reflection coefficients determined according to embodiments of the present invention for a set of different structural parameters. The library entries may also be generated using interpolation from an angular spectrum generated from particular reflection coefficients and their derivatives determined according to embodiments of the present invention.

In angle-resolved scatterometer, with the help of a microscope objective, a spot of light is focused onto a grating. Some of this light is reflected back and passes again through the microscope objective onto a detector. This detector then measures the intensity distribution of this reflected light. Because a detector has a finite resolution (i.e. finite number of pixels of a certain size) only some sort of averaged intensity is measured per pixel.

The computed angular spectrum is determined as follows: the focused spot is represented by a basis of incoming plane waves. This means that each point on the microscope objective corresponds uniquely to one angle of incidence from which a plane wave arrives. If the light source is incoherent, all incoming angles of incidence can be dealt with independently. For a coherent light source, e.g. a laser, the analysis below can be readily extended. Looking at one angle of incidence and its corresponding incoming plane wave we now assume that the grating (which is parameterized by the shape-parameter input) is infinitely periodic. For such a case it can be shown that the reflected light travels along a discrete set of directions, the outgoing angles. These outgoing angles can be found a priori and depend only on the angle of incidence, periodicity of the grating and wavelength of the incident field. Some of these outgoing angles correspond to propagating plane waves that travel back through the microscope objective. Note that each point on the microscope objective can thus be related uniquely to an outgoing angle or direction. It can happen that several different angles of incidence share the same outgoing angle for part of their reflected light (see FIG. 6).

In order to compare the computed spectrum with the measured spectrum, which is only available on a pixelated level due to the presence of the camera, some additional assumptions are necessary. Each measured pixel actually corresponds to a (small) area on the microscope objective. We may assume that the measured intensity in a pixel actually comes from a single point on the microscope objective and this point is determined for example by the coordinates of the center of that pixel. This means that each pixel may be linked to a unique position on the microscope objective and thus uniquely linked to one outgoing angle. The computed spectrum is now simply determined by looping over all pixels, computing the corresponding outgoing angles and looking up all incoming angles that contribute part of their reflected light to that specific outgoing direction. One may then use a forward diffraction model, e.g. RCWA, to compute for each of these angles of incidence what the reflected light would be in the specific outgoing direction. This means that whenever more than one angle of incidence contributes to a specific outgoing angle, additional overhead is created (in the sense that for that pixel additional expensive forward diffraction problems need to be solved). Embodiments of the present invention allow for this extra overhead to be reduced and essentially eliminate (part of) the inner most for-loop in the pseudo-code for the standard approach to compute the angular spectrum below:

```
for i = 1:pixels
    determine outgoing angle from pixel coordinate
    determine all incoming angles that have contribution in outgoing
    angle
    for j = 1:incoming angles
compute reflected light using forward diffraction model
    end
end
```

A similar strategy can be developed for the derivatives of the spectrum with respect to the structural parameters. These derivatives can be approximated using, for example, a simple finite difference approach $$dS_k(p) \approx (S(p+dp_k) - S(p))/dp_k.$$

The additional angular spectra $S(p+dp_k)$ of the slightly perturbed profiles can be computed using the same standard approach or pseudo-code as used for the angular spectrum $S(p)$ of the nominal profile.

This means that K additional spectra are computed for a slightly different set of structural parameters. These additional spectra are computed in exactly the same way as the nominal spectrum, so again the pseudo code as described above can be used for this. An embodiment of the present invention does not require these additional spectra to be computed in order to determine these derivatives from a finite difference scheme. Instead, they are derived by differentiating the linear system directly that was already used to compute the nominal spectrum. This differentiation itself may be performed either analytically or approximately via finite differences. This differentiation also means that the pseudo-code as given above is slightly changed. The inner most for-loop is removed and replaced by one of the four expressions as derived below. This means that in principle for each pixel a different strategy can be chosen. For a pixel with only one contributing order a certain representation is most efficient, whereas for a pixel with more than one contributing order another representation (of the four) may be more efficient.

Not necessarily all pixels are used in the reconstruction. In order to reduce the overall computation time one can perform the reconstruction on a subset of pixels, or alternatively, on superpixels (i.e. pixels in the measured spectrum are grouped together).

Let L denote the linear operator that is associated to the problem of characterizing the scattered field $u_m$ from a periodic grating due to an incident field $f_m$, i.e. $Lu_m = f_m$. Further, let $R_{m,n}$ denote a series of reflection coefficients that depend on the incident wave (through m that represents the different incident wave polarization states) and the outgoing wave (through n that represents the different outgoing wave polarization states and diffraction orders). Then, the reflection coefficients can be written in the following bilinear or sesquilinear form $$R_{m,n} = (u_m, g_n),$$

where $g_n$ depends only on the properties of the outgoing wave. Typically, $g_n$ is a projection of a plane wave at the upper material interface. Further, for incident waves that lie on the diffraction grid, the operator L is identical for all incident waves that contribute to a single outgoing-wave direction.

Now, let $L^+$ denote the adjoint operator of L with respect to the bilinear (or sesquilinear) form $(.,.)$, i.e. $(Lx, y) = (x, L^+y)$ for any x, y.

Further, let $v_n$ denote the solution of $$L^+ v_n = g_n.$$

Then, the sequence of reflection coefficients $R_{m,n}$ can also be written as $$R_{m,n} = (f_m, v_n).$$

Hence, depending on the range of m and n, there may be an advantage to use either the first or the second representation for $R_{m,n}$. For the case of a single outgoing wave and multiple contributing incident waves (as is frequently the case for wide-angle scatterometry), it is advantageous to use the second representation. For example, if there are 2 incoming waves that contribute to a single outgoing wave, then the second representation is more efficient by a factor of 2.

Let us now consider the case where we are also interested in parameter derivatives of the reflection coefficients and let us denote the derivative with respect to the k-th parameter as $\partial_k$. Then we have the following representations for the derivative $\partial_k R_{m,n}$ $$\partial_k R_{m,n} = (\partial_k u_m, g_n) + (u_m, \partial_k g_n) \quad \text{(Expression 1)}$$

$$= (\partial_k f_m, v_n) + (f_m, \partial_k v_n) \quad \text{(Expression 2)}$$

$$= (\partial_k f_m - (\partial_k L)u_m, v_n) + (u_m, \partial_k g_n) \quad \text{(Expression 3)}$$

$$= (\partial_k f_m, v_n) + (u_m, \partial_k g_n - (\partial_k L^+)v_n) \quad \text{(Expression 4)}$$

where for Expression 1 the derivative $\partial_k u_m$ can be obtained by additionally solving the system $$L(\partial_k u_m) = \partial_k f_m - (\partial_k L)u_m$$

and where for Expression 2 the derivative $\partial_k v_n$ can be obtained by additionally solving the system $$L^+(\partial_k v_n) = \partial_k g_n - (\partial_k L^+)v_n$$

The derivation of these four expressions is described below. Again, depending on the range of k, m, and n, the optimum coincides with one of these four representations, where the last two representations are of equal complexity regarding the number of linear systems to be solved. For example, for 7 parameters (k), 1 outgoing wave (n), and 1 incident wave (m), the first and second representation require solving 8 linear systems (i.e. one for $u_m$ and seven for $\partial_k u_m$, for the first representation), whereas the third and fourth representation require only solving 2 linear systems (i.e. one for $u_m$ and one for $v_n$). Hence, a gain of a factor of 4 is obtained in this case.

Choice of Representations

The derivation of the four expressions for $\partial_k R_{m,n}$ is as follows.

$$\partial_k R_{m,n} = \partial_k (u_m, g_n) = (\partial_k u_m, g_n) + (u_m, \partial_k g_n) \quad \text{Expression 1:}$$

$$\partial_k R_{m,n} = \partial_k (f_m, v_n) = (\partial_k f_m, v_n) + (f_m, \partial_k v_n) \quad \text{Expression 2:}$$

$$\partial_k R_{m,n} = (\partial_k u_m, g_n) + (\partial_k g_n) = (\partial_k f_m - (\partial_k L)u_m, v_n) + (u_m, \partial_k g_n), \quad \text{Expression 3 (starting from Expression 1):}$$

where the substitution $\partial_k u_m = L^{-1}(\partial_k f_m) - (\partial_k L)u_m)$ was employed. This relation is obtained by differentiating the original linear problem $Lu_m = f_m$, i.e., $$\partial k(Lu_m) = \partial_k(f_m) => (\partial_k L)u_m + L\partial_k u_m = \partial_k(f_m) => \partial_k u_m = L^{-1}(\partial_k f_m - (\partial_k L)u_m)$$

$$\partial_k R_{m,n} = (\partial_k f_m, v_n) + (f_m, \partial_k v_n) = (\partial_k f_m, v_n) + (u_m, \partial_k g_n - (\partial_k L^+)v_n), \quad \text{Expression 4 (starting from Expression 2):}$$

where the substitution $\partial_k v_n = (L^+)^{-1}(\partial_k g_n - (\partial_k L^+)v_n)$ was employed. This relation is obtained by differentiating the adjoint linear problem $L^+ v_n = g_n$, i.e., $$\partial_k(L^+ v_n) = \partial_k g_n => (\partial_k L^+)v_n + L^+\partial_k v_n = \partial_k g_n => \partial_k v_n = (L^+)^{-1}(\partial_k g_n - (\partial_k L^+)v_n)$$

The criteria for choosing the expressions to obtain $R_{m,n}$ and $\partial_k R_{m,n}$ are as follows.

One of the main criteria for choosing one of the expressions in favor of the others is computational complexity. The complexity of an expression is dominated by the required number of linear system solves.

Each outgoing wave is the result of M incident waves, where M is related to e.g. the directions of incidence and polarization states and M is larger or equal to one. Therefore, computing the amplitude of the outgoing wave requires M forcing incident-field vectors, $f_m$, and N projection vectors, $g_n$, where N is for example related to the polarization states of the detected outgoing wave. If K parameters are considered floating parameters then evaluation of K derivatives are required per outgoing wave direction.

For the case K=0, no derivatives need to be computed. Hence, the reflection coefficients $R_{m,n}$ can be obtained by employing either of the following two expressions, $$R_{m,n} = (u_m, g_n), \text{ where } u_m \text{ is obtained by solving } Lu_m = f_m$$

$$= (f_m, v_n), \text{ where } v_n \text{ is obtained by solving } L^+ v_n = g_n$$

It is now evident that the first expression requires the solutions of M linear systems to obtain $u_m$ and the second expression requires the solutions of N linear systems to obtain $v_n$.

For the case k≠0, the first derivative of the reflection coefficient $R_{n,m}$ can be obtained by employing one of the four previously derived expressions. For the case of M incident waves, N polarizations of the outgoing wave direction, and K floating parameters, the number of linear systems to solve required for the evaluation of each expression has been summarized below.

Table 1 below shows the number of linear systems to solve, in order to evaluate the first derivative of the reflection coefficients $R_{m,n}$ in case of M incident waves, N polarizations of the outgoing wave direction, and K floating parameters.

TABLE 1

|  | $u_m$ | $\partial_k u_m$ | $v_n$ | $\partial_k v_n$ | Total number of systems to solve: |
| --- | --- | --- | --- | --- | --- |
| Expression 1 | M | MK | 0 | 0 | M(1 + K) |
| Expression 2 | 0 | 0 | N | NK | N(1 + K) |
| Expression 3 | M | 0 | N | 0 | M + N |
| Expression 4 | M | 0 | N | 0 | M + N |

For a given configuration the total number of systems to solve is easily evaluated, subsequently taking the minimum will indicate which expression is the most efficient. Here, we have assumed that solving each linear system is equally expensive to solve, which is the case for direct solvers. However, for iterative solvers, some linear systems may prove to be computationally more expensive. In that case, the table above can be augmented by weighting coefficients, which have been previously determined e.g. by extensive testing, to express the difficulty in solving certain linear systems. By taking into account these weighting coefficients, a more accurate estimate of the computational complexity of each representation can be made.

Note that, although expression 3 and 4 share the same complexity in terms of the number of linear systems to solve, the total efficiency of expressions 3 and 4 can differ. This difference in efficiency is related to the number MK of matrix-vector products $(\partial_k L)u_m$ for expression 3 and NK matrix-vector products $(\partial_k L^+)v_n$ for expression 4.

Note also that, when evaluating the first derivative, the evaluation of the reflection coefficients $R_{m,n}$ requires no additional linear-system solves, since either $u_m$ or $v_n$ has already been computed. The derivatives of L, $L^+$ and the derivatives of $f_m$, $g_n$ can also be approximated by finite differences.

Figure 8:
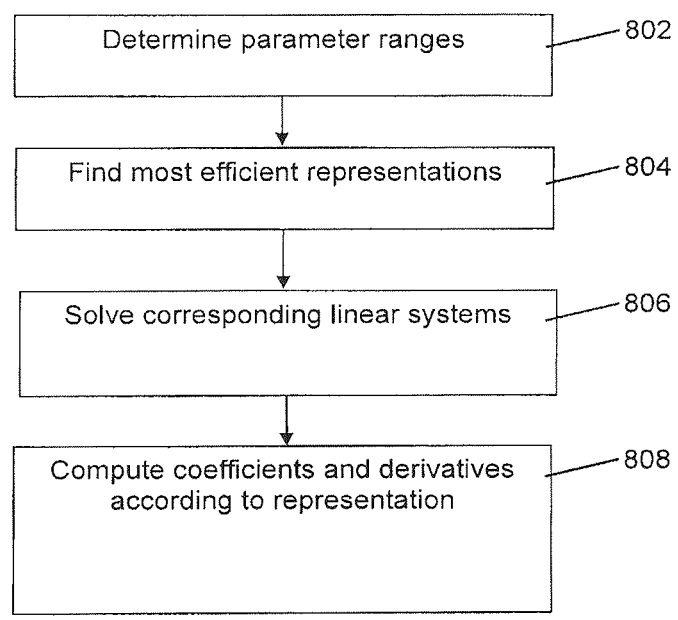
FIG. 8 is a flow chart of steps in determining the reflection coefficients and derivatives, for each outgoing wave, in accordance with an embodiment of the present invention.

With reference to FIG. 8, which shows the steps in determining the reflection coefficients and derivatives, for each outgoing wave:

Determine 802 the number of incident waves, M, that contribute to the outgoing wave direction, the number of detected states (e.g. polarizations) N, and the number of floating parameters, K.

Determine 804, by employing the previously described method, which expression for obtaining the reflection coefficients and their first-order derivative is the most efficient.

Solve 806 the required linear systems for $u_m$, $\partial_k u_m$, $v_n$ and/or $\partial_k v_n$ according to the preceding step.

Compute 808 the required reflection coefficients and their derivatives for the outgoing wave direction, by employing the previously chosen expression.

There is an effect of truncation (for discretization) on the equality of the operators for different angles on the diffraction grid. This is considered below with reference to FIG. 9 that illustrates a unit cell 902 of a periodic structure with a 2-D periodic structure of pillars 904 on a substrate (not shown).

Let a plane wave be incident on a grating plane and let this plane be parallel to the plane z=0. Further, the direction of incidence of the incident plane wave is specified in standard spherical coordinates $\theta^i$ and $\phi^i$. Then the electric field of the incident plane wave can be written in the form $$E^i(x,y,z) = A\exp[-j(K_x^i x + k_y^i y + k_z^i z)],$$

where $k_x^i = k_0 \cos\phi^i \sin\theta^i$, $k_y^i = k_0 \sin\phi^i \sin\theta^i$, $k_z^i = -k_0 \cos\theta^i$. Further, $k_0 = 2\pi/\lambda$ with $\lambda$ the wavelength of the plane wave in the medium. The above formula for the incident electric field demonstrates that the phase in the xy plane progresses linearly with x and y, which also holds for the magnetic field of the incident wave and therefore for the entire incident plane wave.

For a grating, we define a Bravais lattice that indicates the directions of periodicity of the configuration. This Bravais lattice is spanned by two independent vectors, $a_1$ and $a_2$, which lie in the xy plane. These two vectors span the so-called unit cell and the Bravais lattice is now given by $r_{pq} = p a_1 + q a_2$, for p and q integers. Further, we define a reciprocal lattice spanned by the reciprocal vectors $b_1$ and $b_2$ in the xy plane, such that $b_1$ is orthogonal to $a_2$, and $b_2$ is orthogonal to $a_1$. Further, the inner product between $a_1$ and $b_1$ and the inner product between $a_2$ and $b_2$ equals $2\pi$.

Since we consider a fully periodic grating with periodic directions $a_1$ and $a_2$, Maxwell's equations exhibit the same periodic behavior, i.e. Maxwell's equations are identical after a discrete translation by a vector that lies on the Bravais lattice. Since Maxwell's equations are linear, the linearly progressing phase of the incident field yields a set of quasi-periodic relations between the electromagnetic fields on opposite sides of the unit cell.

Let the unit cell be parameterized as $r(\eta_1,\eta_2) = r_0 + \eta_1 a_1 + \eta_2 a_2$ for $\eta_1$ and $\eta_2$ belonging to the interval [0,1]. Then the electric field satisfies the relations $$E(r_0 + \eta_1 a_1) = E(r_0 + \eta_1 a_1 + a_2)\exp[j(k_x^i a_{2x} + k_y^i a_{2y})],$$

$$E(r_0 + \eta_2 a_2) = E(r_0 + a_1 + \eta_2 a_2)\exp[j(k_x^i a_{1x} + k_y^i a_{1y})],$$

for $\eta_1$ and $\eta_2$ belonging to the interval [0,1], and where e.g. $a_{1x}$ denotes the x component of the vector $a_1$. Analogous relations hold for the magnetic field. In any mathematical formulation that aims at solving the Maxwell equations for a periodic configuration with a quasi-periodic excitation, the above relations must be enforced and therefore they constitute a symmetry relation of the pertaining linear operator.

Higher Diffraction Orders

To ease the discussion, we first introduce the vector $k_t^i = k_x^i u_x + k_y^i u_y$, where $u_x$ and $u_y$ denote the unit vectors in the x and y direction, respectively. With this notation, the relations between the fields on opposite sides of the unit cell are now written as $$E(r_0+\eta_1 a_1) = E(r_0+\eta_1 a_1+a_2)\exp[j(k_t^i \cdot a_2)],$$

$$E(r_0+\eta_2 a_2) = E(r_0+a_1+\eta_2 a_2)\exp[j(k_t^i \cdot a_1)],$$

where · denotes the inner product (without conjugation) between two vectors. We now observe that the phase, specified as the argument in the exponential functions, above is only determined up to a multiple of $2\pi$. Hence if a multiple of the reciprocal vectors $b_1$ and $b_2$ is added to $k_t^i$, the above relations still hold, i.e.

$$E(r_0+\eta_1 a_1) = E(r_0+\eta_1 a_1+a_2)\exp[j(k_t^i+pb_1+qb_2)\cdot a_2)],$$

$$E(r_0+\eta_2 a_2) = E(r_0+a_1+\eta_2 a_2)\exp[j(k_t^i+pb_1+qb_2)\cdot a_1)],$$

where p and q are integers. Plane waves that travel from the grating plane upwards and satisfy the above boundary conditions are of the form $$E^i(x,y,z) = A\exp[-j(k_x^i+pb_{1x}+qb_2 x)x - j(k_y^i+pb_{1y}+qb_2 y)y - jk_z^{p,q} z)],$$

where $k_z^{p,q}$ satisfies the relation $$(k_x^i+pb_{1x}+qb_2 x)^2 + (k_y^i+pb_{1y}+qb_2 y)^2 + (k_z^{p,q})^2 = (k_0)^2,$$

in order to be a solution of the Maxwell equations. For the wave to be propagating and to actually radiate energy, $k_z^{p,q}$ must be real-valued. For p=q=0, this condition is satisfied, since we have assumed that the incident wave is also propagating. However, higher values of p and q may not give rise to (propagating) plane waves and therefore there are strict bounds on the integers p and q. These bounds are related to the vectors spanning the Bravais lattice, the wavelength and the angles of incidence $\theta^i$ and of $\phi^i$. If such plane waves exist for p and/or q not equal to zero, then such plane waves are referred to as higher diffraction orders.

Partial Loss of Symmetry Due to Discretization

The above mathematical problem can be formulated via an integral equation or a differential equation and leads to a linear equation that we indicate by $$Lu = f$$

The solution of this equation is usually approximated by a numerical approach, i.e. by discretizing the above equation. In particular, this discretization leads to a matrix equation in which the operator L is replaced by a matrix, and where u and f are replaced by vectors that contain coefficients. The symmetry relations regarding the phase relations on opposite sides of the boundary of the unit cell are usually maintained in the discretized system. However, the symmetry relation that L is identical for each incident wave that contributes to a single outgoing wave is not necessarily maintained in the discretized version of L.

If a spectral discretization is used, i.e. a Fourier-type of expansion is used as a basis in the xy plane, then one typically chooses a finite Fourier series expansion that is centered around the Fourier mode that represents the incoming plane wave. However, to employ the ideas of the outgoing-wave approach of embodiments of the present invention, it is preferable that the discretized version of L remains the same, irrespective of which Fourier mode is used for excitation. Hence, the terms of the Fourier-type of expansion that are taken into account are fixed for all incident plane waves that contribute to an outgoing-wave direction. Moreover, the range of the corresponding number of terms should be sufficiently large such that errors due to truncation of the series are negligible for all incident fields that contribute to a single outgoing wave. Spectral discretizations are employed in e.g. RCWA and the Differential Method. They are also employed in combination with volume or boundary integral equations.

Spatial discretizations are employed in finite-difference and finite-element schemes or in combination with volume or boundary integral equations. For such type of discretization, a mesh is constructed on which the basis functions are defined. To achieve higher accuracy, mesh-refinement and/or polynomial-refinement strategies can be employed. This is typically executed for each excitation problem separately. However, so that the discretized operator remains the same for each incident wave that contributes to the same outgoing wave, it is preferable that mesh- and polynomial-refinement strategies are excitation independent. This means that once the mesh and polynomial choices have been made for one incident wave, they remain fixed for all computations regarding other incident waves. Hence the mesh and the polynomial choices should lead to sufficiently accurate solutions for all incident waves of interest.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The methods according to embodiments of the present invention described above may be incorporated into a forward diffraction model for reconstructing an approximate structure of an object (not limited to 1D-periodic) from a detected electromagnetic scattering property, such as a diffraction pattern, arising from illumination of the object by radiation, as described above with reference to FIG. 7. The processing unit PU described above with reference to FIGS. 3 and 4 may be configured to determine electromagnetic scattering properties such as the angular spectrum S(p) as described with reference to step 706 in FIG. 7 and the derivatives $dS_K(p)$ of the angular spectrum as described with reference to step 716 in FIG. 7. The processing unit PU described above with reference to FIGS. 3 and 4 may be configured to determine approximate structural parameters p' as described with reference to FIG. 7.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The claims in the instant application are different than those of the parent application or other related applications. The Applicant therefore rescinds any disclaimer of claim scope made in the parent application or any predecessor application in relation to the instant application. The Examiner is therefore advised that any such previous disclaimer and the cited references that it was made to avoid, may need to be revisited. Further, the Examiner is also reminded that any disclaimer made in the instant application should not be read into or against the parent application.

What is claimed is:

1. A method of determining electromagnetic scattering properties of a periodic structure, said method comprising:
    numerically solving, using a processing device, a linear system using an adjoint-state operator ($L^+$) and an adjoint-state variable ($v_n$), thereby obtaining an approximate solution of said adjoint-state variable ($v_n$); and
    determining, using said processing device, scattering coefficients ($R_{m,n}$) in an outgoing direction from said structure for radiation incident to said structure based on said obtained approximate solution of said adjoint-state variable ($v_n$) and an incident-field vector ($f_m$) corresponding to said radiation incident to said structure.

2. The method according to claim 1, further comprising obtaining, using said processing device, said adjoint-state operator ($L^+$) by performing a transpose of a linear operator (L) that when operating on a scattered field state variable ($u_m$) produces said incident-field vector ($f_m$).

3. The method according to claim 2, wherein said transpose comprises a conjugate transpose.

4. The method according to claim 2, further comprising determining, using said processing device, a derivative of said scattering coefficients ($\partial_k R_{m,n}$), said determining comprising:
    computing:
        a derivative ($\partial_k f_m$) of said incident-field vector ($f_m$),
        a derivative ($\partial_k L$) of said linear operator (L), and
        a derivative ($\partial_k g_n$) of a predetermined projection vector ($g_n$); and
    combining said computed derivatives to obtain said derivative of said scattering coefficients ($\partial_k R_{m,n}$).

5. The method according to claim 1, further comprising determining, using said processing device, a derivative of said scattering coefficients ($\partial_k R_{m,n}$), said determining comprising:
    computing:
        a derivative ($\partial_k f_m$) of said incident-field vector ($f_m$),
        a derivative ($\partial_k g_n$) of a predetermined projection vector ($g_n$), and
        a derivative ($\partial_k L^+$) of said adjoint-state operator ($L^+$); and
    combining said computed derivatives to obtain said derivative of said scattering coefficients ($\partial_k R_{m,n}$).

6. The method according to claim 1, further comprising determining, using, said processing device, a derivative of said scattering coefficients ($\partial_k R_{m,n}$), said determining comprising:
    computing:
        a derivative ($\partial_k f_m$) of said incident-field vector ($f_m$), and
        a derivative ($\partial_k v_n$) of said adjoint-state variable ($v_n$); and
    combining said computed derivatives to obtain said derivative of said scattering coefficients ($\partial_k R_{m,n}$),
    wherein said derivative ($\partial_k v_n$) of said adjoint-state variable is obtained by numerically solving a system using:
        said adjoint-state operator ($L^+$);
        a derivative ($\partial_k g_n$) of a predetermined projection vector ($g_n$); and
        a derivative ($\partial_k L^+$) of said adjoint-state operator.

7. The method according to claim 1, further comprising:
    providing a plurality of expressions for determining derivatives of said scattering coefficients ($R_{m,n}$);
    selecting an expression of said plurality of expressions to minimize a number of linear systems to solve; and
    using said selected expression to determine a derivative ($\partial_k R_{m,n}$) of said scattering coefficients.

8. The method according to claim 7, wherein said providing of said plurality of expressions, said selecting of said expression, and said using of said selected expression are performed for a plurality of outgoing directions, wherein different expressions are selected for at least two different outgoing directions.

9. The method according to claim 1, wherein said determining of said scattering coefficients ($R_{m,n}$) in an outgoing direction from said structure is performed for radiation incident to said structure at a plurality of incoming directions.

10. The method according to claim 9, further comprising a step of spectral discretization that comprises using a fixed set of expansion terms for all of said plurality of incoming directions.

11. The method according to claim 9, further comprising a step of spatial discretization that comprises using a fixed mesh for all of said plurality of incoming directions, and using a fixed polynomial expansion for each respective mesh element.

12. An apparatus for determining electromagnetic scattering properties (S(p)) of a periodic structure, said apparatus comprising:
a processor configured to:
obtain at least one estimated structural parameter (p); and
determine at least one model electromagnetic scattering property S(p)) from said at least one estimated structural parameter (p) by:
numerically solving a linear system using an adjoint-state operator ($L^+$) and an adjoint-state variable ($v_n$), thereby obtaining an approximate solution of said adjoint-state variable ($v_n$); and
determining scattering coefficients ($R_{m,n}$) in an outgoing direction from said structure for radiation incident to said structure based on said obtained approximate solution of said adjoint-state variable ($v_n$) and an incident-field vector ($f_m$) corresponding to said radiation incident to said structure.

13. A non-transitory computer program product containing one or more sequences of machine-readable instructions for determining electromagnetic scattering properties (S(p)) of a periodic structure, the instructions being adapted to cause one or more processors to perform a method of determining electromagnetic scattering properties (S(p)) of a periodic structure, said method comprising:
numerically solving a linear system using an adjoint-state operator ($L^+$) and an adjoint-state variable ($v_n$), thereby obtaining an approximate solution of said adjoint-state variable ($v_n$); and
determining scattering coefficients ($R_{m,n}$) in an outgoing direction from said structure for radiation incident to said structure based on said obtained approximate solution of said adjoint-state variable ($v_n$) and an incident-field vector ($f_m$) corresponding to said radiation incident to said structure.

14. A method of determining structural parameters (p) of a periodic structure from a detected electromagnetic scattering property (M) arising from illumination of said structure by radiation, said method comprising:
obtaining, using a processing device, at least one estimated structural parameter(p);
determining, using said processing device, at least one model electromagnetic scattering property (S(p)) from said at least one estimated structural parameter (p);
comparing, using, said processing device, said detected electromagnetic scattering property (M) to said at least one model electromagnetic scattering property (S(p)); and
determining, using said processing device, an approximate structural parameter (p') based on a result of said comparing,
wherein said model electromagnetic scattering property (S(p)) is determined using a method of determining electromagnetic scattering properties of a periodic structure, said method comprising:
numerically, using said processing device, solving a linear system using an adjoint-state operator ($L^+$) and an adjoint-state variable ($v_n$), thereby obtaining an approximate solution of said adjoint-state variable ($v_n$); and
determining, using said processing device, scattering coefficients ($R_{m,n}$) in an outgoing direction from said structure for radiation incident to said structure based on said obtained approximate solution of said adjoint-state variable ($v_n$) and an incident-field vector ($f_m$) corresponding to said radiation incident to said structure.

15. The method according to claim 14, further comprising:
arranging, using said processing device, a plurality of said model electromagnetic scattering properties (S(p)) in a library; and
comparing, said processing device, said detected electromagnetic scattering property (M) with contents of said library, wherein said comparing comprises matching said detected electromagnetic scattering property (M) contents, of said library.

16. A method according to claim 14, further comprising iterating said obtaining of said at least one estimated structural parameter (p), said determining of said at least one model electromagnetic scattering property (S(p)), and said comparing of said detected electromagnetic scattering property (M), wherein said obtaining of said at least one estimated structural parameter (p) comprises updating said at least one estimated structural parameter (p) based on a result of said comparing in a previous iteration.

17. An inspection apparatus for determining structural parameters (p) of a periodic structure, said inspection apparatus comprising:
an illumination system configured to illuminate said structure with radiation;
a detection system configured to detect an electromagnetic scattering property (M)) arising from said illumination:
a processor configured to:
obtain at least one estimated structural parameter (p);
determine at least one model electromagnetic scattering property (S(p)) from said at least one estimated structural parameter (p);
compare said detected electromagnetic scattering property (M) to said at least one model electromagnetic scattering property (S(p)); and
determine an approximate structural parameter (p') based on a result of the comparison,
wherein said processor is configured to determine said model electromagnetic scattering property (S(p)) by:
numerically solving a linear system using an adjoint-state operator ($L^+$) and an adjoint-state variable ($v_n$), thereby obtaining an approximate solution of said adjoint-state variable ($v_n$); and
determining scattering coefficients ($R_{m,n}$) in an outgoing direction from said structure for radiation incident to said structure based on said obtained approximate solution of said adjoint-state variable ($v_n$) and an incident-field vector ($f_m$) corresponding to said radiation incident to said structure.

* * * * *

UNITED STATES PATENT AND TRADEMARK OFFICE
CERTIFICATE OF CORRECTION

PATENT NO. : 8,645,109 B2  
APPLICATION NO. : 12/955463  
DATED : February 4, 2014  
INVENTOR(S) : Dirks et al.

Page 1 of 1

It is certified that error appears in the above-identified patent and that said Letters Patent is hereby corrected as shown below:

Claims
In column 21, line 25, claim 12, after "property" please delete "S(p))" and insert --(S(p))--.
In column 22, line 23, claim 15, after "comparing," please insert --using--.
In column 22, line 27, claim 15, before "contents," please insert --to--.

Signed and Sealed this
First Day of March, 2016

Michelle K. Lee
*Director of the United States Patent and Trademark Office*